United States Patent [19]

Herlein et al.

[11] Patent Number: 4,837,521
[45] Date of Patent: Jun. 6, 1989

[54] DELAY LINE CONTROL SYSTEM FOR AUTOMATIC TEST EQUIPMENT

[75] Inventors: Richard F. Herlein, San Jose; Jeffrey A. Davis, Santa Clara, both of Calif.

[73] Assignee: Schlumberger Systems & Services, Inc., Sunnyvale, Calif.

[21] Appl. No.: 135,782

[22] Filed: Dec. 21, 1987

Related U.S. Application Data

[63] Continuation-in-part of Ser. No. 70,130, Jul. 2, 1987, Pat. No. 4,789,835.

[51] Int. Cl.[4] .................. H03K 17/00; G06K 5/04
[52] U.S. Cl. ............................ 328/72; 328/55; 307/269; 307/590; 371/1
[58] Field of Search ............... 307/269, 590; 324/73, 324/73 R; 328/55, 63, 72; 371/1, 20; 377/19, 26, 27, 29, 44, 54

[56] References Cited

U.S. PATENT DOCUMENTS 4,277,693  7/1981  Hoekman .......................... 307/269
4,468,624  8/1984  Rehbein et al. .................... 328/55
4,488,297  12/1984  Vaid .................................. 328/55
4,564,953  1/1986  Werking ........................... 307/269

Primary Examiner—Stanley D. Miller
Assistant Examiner—Timothy P. Callahan
Attorney, Agent, or Firm—David H. Carroll; Robert C. Colwell

[57] ABSTRACT

A system is disclosed which enables signals to be supplied at precisely desired times in an automatic test system. The apparatus includes a base delay memory which stores information representing the higher order bits of a time delay, while vernier memories store information relating to the lower order bits of the time delay. Offset memories enable storing calibration data. The base delay memory controls at least two counters in independent signal paths, while the vernier and offset memories control appropriate deskew units for further delaying the counter output signal as desired. The system enables sharing of resources, yet eliminates the need for repetitively loading correction data for deskew operations.

6 Claims, 3 Drawing Sheets

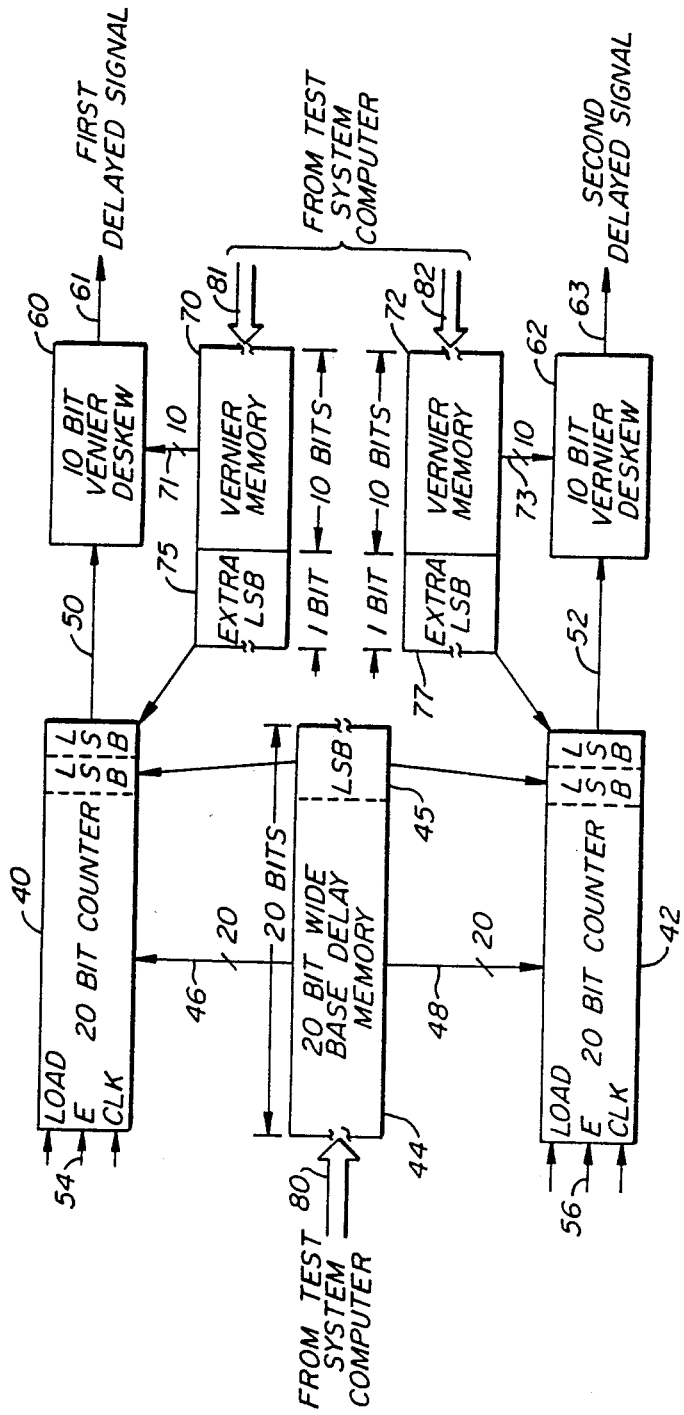
FIG._1.

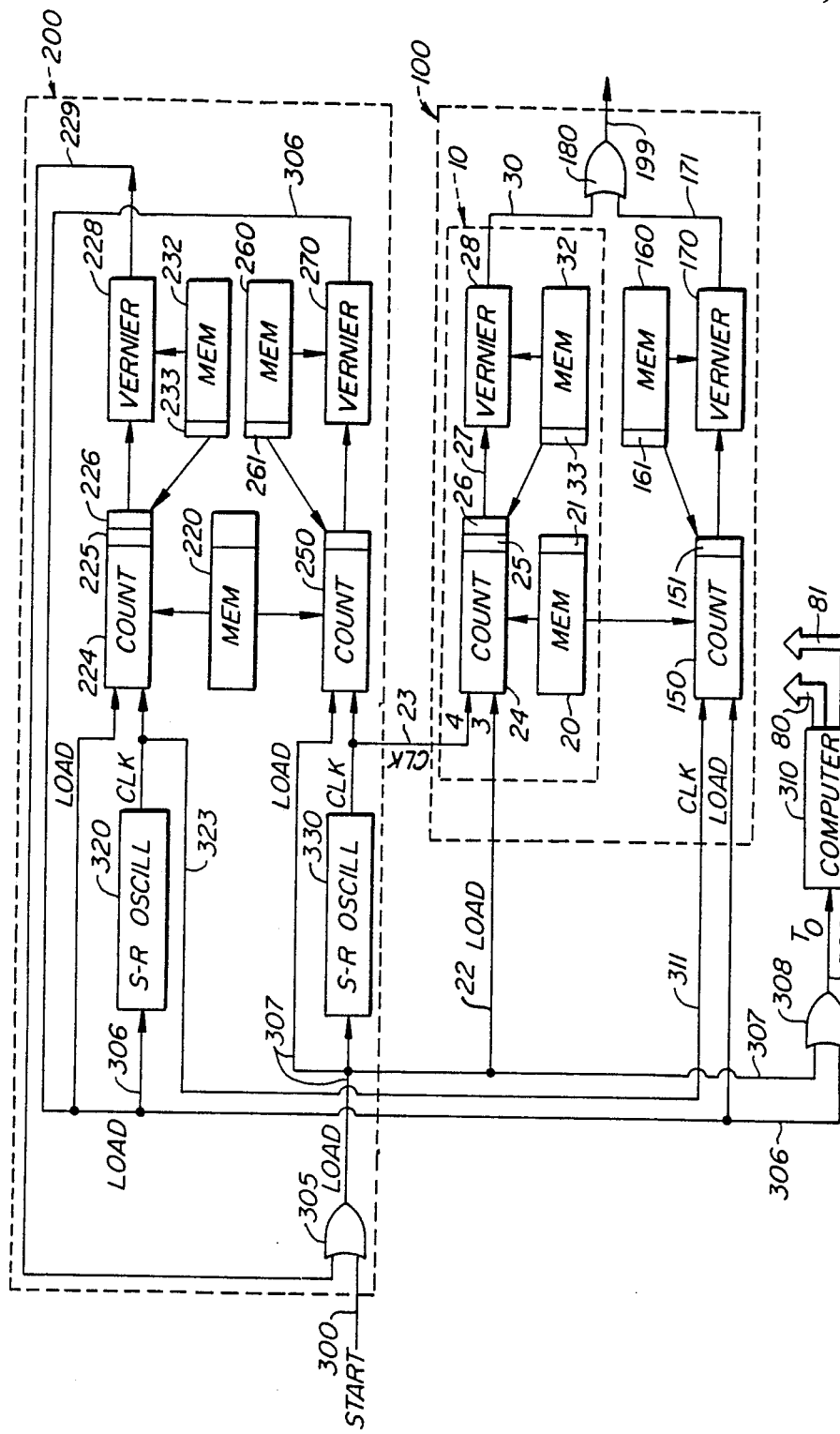
FIG._2.

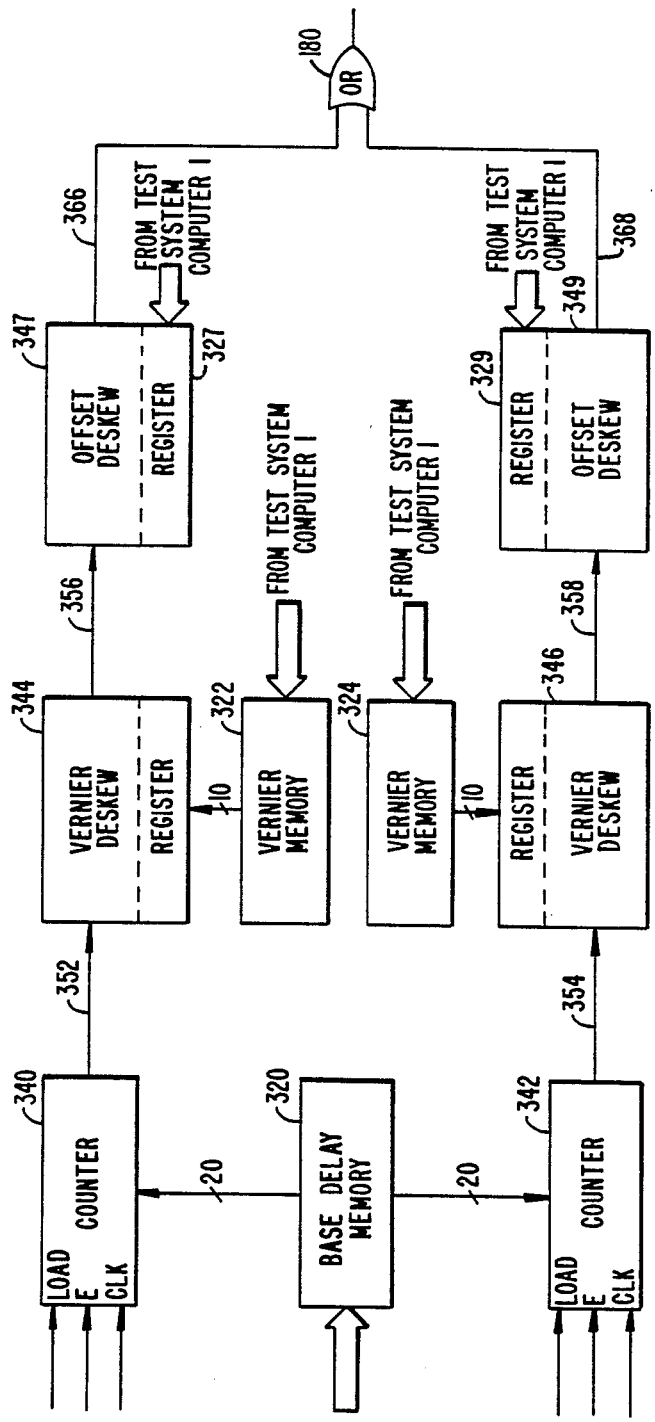
FIG._3.

DELAY LINE CONTROL SYSTEM FOR AUTOMATIC TEST EQUIPMENT

BACKGROUND OF THE INVENTION

Reference to Related Application

This application is a continuation-in-part of prior U.S. patent application Ser. No. 70,130, filed July 2, 1987, now U.S. Pat. No. 4,789,835, and entitled "Control of Signal Timing Apparatus in Automatic Test Systems Using Minimal Memory."

Field of the Invention

This invention relates to automatic test equipment for testing integrated circuits and to the control of signal timing apparatus in such equipment. In particular, the invention relates to the control of apparatus for delaying electrical signals by desired time intervals in automatic test equipment.

Description of the Prior Art

Automatic test systems for the testing of integrated circuits are well known and employed throughout the semiconductor industry. In such test systems a semiconductor device under test is subjected to patterns of stimuli signals, and the resultant output conditions are monitored and analyzed to determine the functionality and/or quality of the device being tested. As integrated circuit technology advances, the manufacturers of such automatic test systems must provide the capability of testing increasingly complex, very high speed circuits with a high degree of precision. In such test systems to assure the validity of the test results, the timing system must cause input signal transitions and output strobe signals to occur precisely at pre-programmed times at the device under test. A further complicating factor in such systems is that the signals being supplied to, and received from, the terminals of the device being tested, travel over many different paths through the system circuitry. Because the different paths have different propagation delays, the propagation delays must be corrected to assure that the patterns of test signals supplied, and that the output signals detected, are validly interpreted.

SUMMARY OF THE INVENTION

A more economical and efficient method of controlling the timing of signals in test systems is needed to enable adjustment of the timing of signals in a manner necessitated by the characteristics of the system and the circuit being tested. In copending commonly-assigned U.S. patent application entitled "Method and Apparatus for Dynamically Controlling the Timing of Signals in Automatic Test Systems," filed on May 17, 1984, now U.S. Pat. No. 4,675,562, a dynamically controllable system is described for controlling the timing of signals in automatic test systems. The system described in that application provides for controllably delaying electrical signals, and includes a cascaded series of stages for "fine tuning" the timing of signals passing through the apparatus described. The system described herein provides apparatus for controlling the cascaded stages described in that application, in particular, by providing control signals for the cascaded timing elements.

In a preferred embodiment, apparatus for supplying signals at desired times includes a pair of independent signal paths. Each path includes a signal generator, typically a counter, connected serially to a vernier delay apparatus, which is connected serially with an offset delay apparatus. The signal generators for the independent paths generate a signal a fixed amount of time following receiving a start signal, with the fixed amount of time for both signal paths being defined by a base time delay stored in a single register coupled to both signal generators. Typically, the base time delay represents the higher order 20 bits of a delay specified with 30-bit precision. The signal from the respective signal generators then is further delayed by the vernier delay under control of a vernier delay register, typically containing the lower order 10 bits of the 30-bit delay. A separate vernier register is provided for each signal path, and allows correction for nonlinearily in the signal path. Finally, the output signals from the vernier delay apparatus are further delayed by an offset delay, which in the preferred embodiment is specified by the 10 bits of equal significance to the lower order 10 bits of the time delay. The offset reigster allows correction for the differing time delays of the signal generator and vernier delay apparatus from one printed circuit board to another, i.e., matching of all boards in the system. The apparatus is particularly advantageous as it enables extending the range of permissible time delays. Furthermore, the invention minimizes the dead time by allowing the user to program timing signals over a larger portion of the desired interval.

BRIEF DESCRIPTION OF THE DRAWINGS

FIG. 1 is a block diagram illustrating a preferred embodiment of the invention;

FIG. 2 is a block diagram illustrating an application of the invention to the generation of timing signals in automatic test systems; and FIG. 3 is a block diagram illustrating an alternative embodiment of the invention.

DETAILED DESCRIPTION OF THE PREFERRED EMBODIMENTS

The apparatus shown in FIG. 1 provides a technique for generating first and second delayed signals at desired times, which times are precisely controllable by the automatic test system with an extremely high degree of accuracy. As such, the system depicted enables compensation for the propagation differences in the paths followed by the first and second delayed signals. In the apparatus shown, each of counters 40 and 42 are controlled by data stored in a 20-bit-wide base delay memory 44. Memory 44 will contain information as to the "rough" magnitude of the delay to be applied to the signals, that is, the more significant bits of the digital representation of the value of the time delay. This information is transmitted to counter 40 via bus 46 and to counter 42 via bus 48. In response to the information supplied from base delay memory 44, and when enabled via signals received on lines 54 and 56, respectively, counters 40 and 42 will supply an output signal over lines 50 and 52, respectively. The exact timing of the output signals from the counters is determined by one or more clock signals supplied to the counters. In effect, the counters control signal paths to pass timing signals at the appropriate instant.

The output signals from counters 40 and 42 are received by vernier delay apparatus 60 and 62, respectively. Each of the verniers 60 and 62 delay the signal received on their respective incoming lines 50 and 52 for a time determined by the contents of vernier memories 70 and 72. The contents of each of these memories, in turn, is determined by data from the test system computer. Each vernier memory may be as "deep" as desired, that is, may contain information for the time delays to be imposed in a sequence of test system operations. The vernier memories communicate over buses 71 and 73 with the vernier signal delay apparatus 60 and 62. Each of vernier delay apparatus 60 and 62 will delay the signal received on incoming lines 50 and 52 by a time determined by the information supplied on lines 71 and 73. The specific manner in which vernier deskew elements 60 and 62 operate is described in detail in U.S. Pat. No. 4,657,562 entitled "Method and Apparatus for Dynamically Controlling the Timing of Signals in Automatic Test Systems." In that patent a system of four deskew elements are cascaded to provide wide ranging accurate control of signal timing. The four elements combined are referred to herein as vernier delay deskew elements to differentiate them from the counters, but it should be understood these verniers may be other well known apparatus, with as many or few as desired cascaded together. The ultimate accurately delayed signals will be supplied to any desired apparatus on lines 61 and 63 as shown. In a preferred embodiment, the signals on lines 61 and 63 are two phases of the same signal.

Of particular advantage to the apparatus of this invention is the feature that a single base delay memory 44 may be used to control many signal paths, with separate vernier memories used for the individual signal paths to precisely control the timing of the signals there. In the embodiment shown in FIG. 1, the base delay memory is used to control two counters, 40 and 42, and hence two signal paths; however, as many counters and signal paths as desired could be controlled, with the ultimate number depending only upon the number of signal paths on which delayed signals are desired at times within the range of the significance of the bits stored in the base delay memory 44.

In one embodiment each of the vernier memories 70 and 72 include a most significant bit 75 and 77 which is a duplicate, in terms only of significance, of the least significant bit of base delay memory 44. The word "duplicate" is used herein to mean duplicative of the magnitude of the least significant bit of base delay memory 44, but not necessarily duplicative of the actual contents of the least significant bit 45 of the base delay memory 44. For example, for the specific embodiment illustrated in FIG. 1, bits 75 and 77 of correction memories 70 and 72 would represent $2^{10}$, as would least significant bit 45 of memory 44. That is, a logical one in bit register 75 would represent $1 \times 2^{10}$ while a logical zero in register 75 would represent $0 \times 2^{10}$. Similarly, a one in register 45 would represent $1 \times 2^{10}$, and a zero would represent $0 \times 2^{10}$. In this manner, a carry from the 10 bits of correction memory 70 is not propagated into the base delay memory 44 but is propagated and stored in register 75 as an extra least significant bit of the same power of two as the least significant bit 45 in base delay memory 44. In some embodiments of the invention, the significance of the bits may control the vernier in a nonbinary manner, that is, a bit may not provide a delay twice that of a next less significant bit.

The apparatus of FIG. 1 operates in the following manner. Data from the test system computer is loaded into base delay memory 44 via bus 80, into vernier memory 70 over bus 81, and into vernier memory 72 over bus 82. Typically, each of these memories is many bits deep with each "row" of bits representative of the desired delay for a particular test, and with the collective memory representative of the desired delays for a sequence of many tests. In a well known manner, the contents of the base delay memory 44 are loaded into counters 40 and 42 to provide data indicative of the approximate time at which delayed signals 61 and 63 are to be supplied. For the example depicted, the approximate time is the 20 most significant bits of a time specified to 30-bit accuracy. Of course, each bit can represent any desired time interval, but in the preferred embodiment, the contents of the least significant bit register of each of correction memories 70 and 72 represents 10 picoseconds, while the contents of the least significant bit 45 of base delay memory 44 represents 5 nanoseconds.

In the preferred embodiment, counters 40 and 42 will permit clock signals to be supplied on lines 50 and 52 when a terminal count is reached. A terminal count is reached whenever the contents of all stages of the counter are zero. Thus, if the extra least significant bits 75 and 77 of vernier memory 70 and 72 are zero, and other bits supplied from base delay memory 44 are not zero, the other bits are counted down to zero in a binary fashion and a signal supplied on lines 50 and 52. If the extra least significant bits 75 and 77 are one, they are first counted to zero, and then all other bits of the counter are counted down to zero, including, any bit stored in register 45. After a signal is supplied, the test system computer loads a one into the least significant bit 45 to prevent the counters 40 and 42 from sending other output pulses on lines 50 or 52 until the counter is properly reloaded from a desired "row" of base delay memory 44, and/or to enable reloading of the memories.

The apparatus of FIG. 2 illustrates one application for the system depicted in FIG. 1. A pulse generator 10 in timing edge generator 100 includes a base delay memory 20 having a first bit width, preferably 20 columns, a depth of preferably 16 rows, and a counter 24 having 20 binary bits and responsive to a duplicate LSB 26. Generator 10 also includes a pulse delay vernier 28 of preferably 10 bits resolution, and a vernier memory 32 one bit wider than the vernier and the same depth as memory 20.

As explained above, the power of the most significant bit 33 in vernier memory 32 is duplicated in the least significant bit 21 in memory 20. The most significant bit 33 is loaded into register 26 of counter 24 which allocates the same effect to bits 25 and 26. When counter 24 is clocked to zero, it produces a pulse on line 27 which is delayed by a desired interval by vernier deskew apparatus 28 in response to the correction supplied by the remaining bits of memory 32.

Timing edge generator 100 generates pulses in two phases, each references to a time $T_0$. The pulses can occur close to or even later than the next $T_0$. The phase outputs are combined by OR gate 180 and supplied on output line 199. Because the corrections for the two phases are generally different, a two-phase generator could require separate 30-bit memories to store the separate timing data. As discussed above, however, the present invention eliminates the need for extra memory because carries from the correction values in memories 32 and 160 are not propagated through to the base timing data in memory 20. Hence, the memory 20 serves both counters 24 and 150 in two-phase timing edge generator 100.

The counter, vernier delay apparatus, and memory arrangement 10 is also used in period generator 200. To support the two-phase timing edge generator 100, period generator 200 also uses two counters 224 and 250 and two verniers 228 and 270. The pulse generator circuit including memory and registers is duplicated to allow pulse generation by one circuit while the other circuit is loaded with a new value and restarted. Stop-restart oscillators 320 and 330 supply clock signals carrying the timing information to all counters.

Before the test system can accurately test integrated circuits, the pulse generators must be calibrated. To calibrate, the most significant bits of the programmed delays are loaded into memories 20 and 220. If the oscillator frequency is 200 megaHertz, the most significant bits of these memories will represent a value of the desired period divided by 5 nanoseconds, minus any remaining fraction. The less significant bits representing the remaining fraction are loaded into the vernier memories. A start pulse is applied to line 300, and the synchronization errors between the arrival of pulses at output terminals of pulse generator circuits for others of the pins on the integrated circuit being tested are measured. Correction values are calculated to replace values stored in the vernier memories 32, 160, 232, 260. These corrections may result in a binary 1 in the eleventh and most significant bits 33, 61, 233, and/or 261 of the correction memories.

Once calibrated, the base delay and correction memories are loaded by the test system computer. A start pulse applied to line 300 passes through OR gate 305 to provide a "load" signal on line 307. Load signals are combined by OR gate 308 to form the period signal $T_0$ on line 309. The test system computer uses the period signal $T_0$ to select addresses for appropriate delays from a range of 16 values stored in the 16 rows of memories 20 and 220. The load signals 306 and 307 are respectively applied to the counters 150 and 224, and 24 and 250, to load the selected values from memories 20 and 220. The load signals 306 and 307 also activate stop-restart oscillators 320 and 330, which supply clock pulses with a 5-nanosecond period on lines 323 and 23, respectively. The clock pulses count down their respective counters, which will typically contain different values.

When a counter has counted down to zero, it supplies a pulse whose timing is determined by the 5 nanosecond period of the oscillator. The pulse is delayed again by an appropriate amount and controlled to a resolution of 10 picoseconds by the respective vernier.

The vernier in each half of period generator 200 is also coupled to the stop-restart oscillator for the other half of the period generator. Each time a pulse emerges from OR gate 305, the output signal passes through OR gate 308 as $T_0$ signal on line 309, which, when supplied to the test system computer, causes it to select new memory addresses, thereby accessing the next period and timing edge data.

The timing edge generator counters are loaded and clocked by the same pulses as activate the corresponding phase of the period generator. The verniers must also be loaded, typically after the counters to minimize dead time. The output signals from timing edge generator verniers 28 and 170 are combined by OR gate 180 to form the timing edge pulse train on line 199. The single two-phase timing edge generator 100 shown in FIG. 2 generates an average of one timing pulse per period. The period generator may also support more than one timing edge generator 100 so that two or more timing edges per period may be generated, even on the same output line.

FIG. 3 is a block diagram of an alternative embodiment of the invention which is employed to extend the range of permissible time delays. In the system of FIG. 1, it is necessary to reserve a portion of the range of delays in the vernier apparatus to allow for the maximum possible offset. The apparatus of FIG. 3 eliminates this restriction. In the system shown in FIG. 1, the 10-bit vernier memories contain the arithmetic sum of the vernier delay required, together with the calibration delay necessary to deskew any delays introduced by the 20-bit counter 40, 42, and the 10-bit vernier deskew units 60, 62. Thus, in effect, for each machine cycle (or row of data within the vernier memories), it was necessary to compute the sum of these two delays and store that value within the vernier memory. The apparatus shown in the block diagram of FIG. 3 extends the permissible interval for timing signals.

The circuit of FIG. 3 includes a base delay memory 320, a pair of counters 340, 342, a pair of vernier memories 322, 324, a pair of vernier deskew units 344, 346, and a pair of offset deskew units 347, 349, with accompanying registers 327, 329. The base delay memory is preferably the same type base delay memory described in conjunction with FIG. 1. The vernier memories 322, 324 are preferably 10 bits wide, and as "deep" as counter memory 320. Each of the vernier deskew units 344, 364, preferably includes a one word register for storing the time delay to be employed in the next cycle of operation. In the preferred embodiment, each of the vernier memories will store the lower order 10 bits of a nonlinearity correction time delay specified with 30-bit accuracy, while the offset deskew units will store an offset correction up to 10 bits in length. Thus, the total time delay desired for either the upper or lower signal path is reflected by the combined contents of the base delay memory 320 the appropriate one of the vernier memories 322, 324, and the appropriate offset register 327, 329.

A digital representation of an offset time delay desired which is stored in registers 327 and 329 allows correcting the time delay of the particular printed circuit board upon which the circuitry of FIG. 3 is embodied to match all other similar boards in the test system. This digital representation is determined by the test system computer during calibration and is made to be a value which compensates for various delays in the system, which delays are independent of the desired deskew. As indicated by the wide arrows in FIG. 3, each of the memories is loaded with data supplied by the test system computer.

The system shown in FIG. 3 operates in a manner analogous to that described in conjunction with FIG. 1. That is, data from the base delay memory is loaded into each of counters 340 and 342, which begin counting in response to an enable or start signal. After counting the number indicated by the contents of the base delay memory, the counters supply a signal on lines 352 and 354, respectively. The signals from the counters are typically positioned with 5 nanosecond accuracy in reliance upon a 200 megaHertz clock signal.

Each of the vernier deskew units 344, 346 receives the counter output signal and delays it by the amount indicated by the digital value stored in the associated vernier memories. The first delayed signal from the vernier deskew units is thus supplied on lines 356 and 358. In a similar manner, the offset deskew units delay the signals received on lines 356 and 358 by an amount of time represented by the digital value within the offset memories 327 and 329. The resulting output signals, delayed as specified by the contents of the base delay memory and vernier memory, and as necessary by the calibration amount stored within the offset memories, are supplied on lines 366 and 368. In the preferred embodiment, such as the application for the circuitry shown in FIG. 2, the output signals on lines 366 and 368 are ORed together by gate 180.

In the preceding description details have been disclosed to illustrate the invention and a preferred embodiment. These details have been provided only for illustration. The scope of the invention may be determined by the following claims.

I claim:

1. Apparatus for supplying a signal after a predetermined time delay comprising:
   a base delay storage means for storing at least one first sequence of bits being a digital representation of higher order bits of the value of both a first and a second time delay;
   a first vernier delay storage means for storing at least one second sequence of bits being a digital representation of lower order bits of the value of the first time delay;
   a first offset storage means for storing at least one first offset sequence of bits being a digital representation of a correction to the value of the first time delay;
   first and second generating means coupled to the base delay storage means, each connected to receive independent start signals, and each means for supplying respective first and second signals an amount of time after receiving the start signals as represented by the first sequence of bits;
   first vernier delay means connected to receive the first signal from the first generating means and connected to the first vernier delay storage means, the first delay means for supplying a first delayed signal an amount of time after receiving the first signal as represented by the second sequence of bits; and
   first offset means connected to receive the first delayed signal and connected to the first offset storage means, the first offset means for supplying a final first delayed signal an amount of time after receiving the first delayed signal as represented by the first offset sequence of bits.

2. Apparatus as in claim 1 wherein the at least one first sequence of bits comprises a plurality of first sequences of bits and wherein the at least one second sequence of bits comprises a plurality of second sequences of bits.

3. Apparatus as in claim 1 further comprising:
   a second vernier delay storage means for storing at least one third sequence of bits being a digital representation of lower order bits of the value of the second time delay;
   a second offset storage means for storing at least one second offset sequence of bits being a digital representation of a correction to the value of a second time delay;
   second vernier delay means connected to receive the second signal from the second generating means and connected to the second vernier delay storage means, the second vernier delay means for supplying a second delayed signal an amount of time after receiving the second signal as represented by a third sequence of bits; and
   second offset means connected to receive the second delay signal and connected to the second offset storage means, the second offset means for supplying a final second delayed signal an amount of time after receiving the second delayed signal as represented by the second offset sequence of bits.

4. Apparatus as in claim 1 wherein the first generating means comprises:
   a first source of clock signals for providing a sequence of clock pulses; and
   a first counting means connected to receive the clock pulses from the first source of clock signals for counting the number of the clock pulses as represented by the first sequence of bits, and upon completing such count, to supply the first signal.

5. Apparatus as in claim 4 wherein the first signal comprises a clock pulse from the first source of clock signals, the particular clock pulse comprising the clock pulse supplied from the first source of clock signals after the first counting means has completed the count.

6. Apparatus as in claim 3 wherein the second generating means comprises:
   a second counting means connected to receive the clock pulses from the first source of clock signals to count a number of the clock pulses as represented by the third sequence of bits, and upon completing such count to supply the second signal.

* * * * *